United States Patent [19]
Park et al.

[11] Patent Number: 5,726,082
[45] Date of Patent: Mar. 10, 1998

[54] SEMICONDUCTOR DEVICE AND METHOD FOR FABRICATING THE SAME

[75] Inventors: Chan Kwang Park; Yo Hwan Koh, both of Ichon, Rep. of Korea

[73] Assignee: Hyundai Electronics Industries Co., Ltd., Ichon, Rep. of Korea

[21] Appl. No.: 670,839

[22] Filed: Jun. 28, 1996

[30] Foreign Application Priority Data

Jun. 30, 1995 [KR] Rep. of Korea ............ 95-18870

[51] Int. Cl.$^6$ ............................................. H01L 21/265
[52] U.S. Cl. .................. 438/165; 438/164; 438/294; 438/412; 438/770
[58] Field of Search ............... 437/40 TFT, 41 TFT, 437/211, 968; 438/165, 164, 294, 412, 770

[56] References Cited

U.S. PATENT DOCUMENTS

| | | | |
|---|---|---|---|
| 4,183,134 | 1/1980 | Oehler | 437/56 |
| 4,950,618 | 8/1990 | Sundaresan | 437/40 |
| 5,130,264 | 7/1992 | Troxell | 437/40 |
| 5,283,456 | 2/1994 | Hsieh et al. | 257/347 |
| 5,470,763 | 11/1995 | Hamada | 437/21 |
| 5,482,871 | 1/1996 | Pollack | 437/21 |
| 5,496,750 | 3/1996 | Moslehi | 437/41 |

FOREIGN PATENT DOCUMENTS

| | | |
|---|---|---|
| 56-88354 | 7/1981 | Japan. |
| 4-316333 | 11/1992 | Japan. |

*Primary Examiner*—John Niebling
*Assistant Examiner*—Brendan Mee
*Attorney, Agent, or Firm*—Reid & Priest, L.L.P.

[57] ABSTRACT

A semiconductor device having a silicon-on-insulator structure, and a method for fabricating the semiconductor device, wherein a thick silicon oxide film is formed on each side wall of an active silicon substrate, thereby obtaining an increased threshold voltage at the edge of the active silicon substrate. The semiconductor device includes a first silicon substrate, a first silicon oxide film formed over the first silicon substrate, a second silicon substrate on the first silicon oxide film, second silicon oxide films, respectively disposed on opposite side walls of the second silicon substrate, a gate oxide film formed on the second silicon substrate, a gate electrode formed over the gate oxide film, and source/drain impurity diffusion regions, respectively formed in portions of the second silicon substrate disposed at both sides of the gate electrode. An impurity doped region having a conduction type opposite to that of the second silicon substrate, is defined between each side wall of the second silicon substrate and each corresponding second silicon oxide film in order to obtain an increased threshold voltage. Thus, the present invention easily controls threshold voltage, thereby improving in production yield.

9 Claims, 3 Drawing Sheets

5,726,082

1

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device having a silicon-on-insulator (SOI) structure, and a method for fabricating the same.

2. Description of the Prior Art

In the fabrication of semiconductor devices, formation of a SOI structure is involved to achieve an isolation between adjacent elements, thereby obtaining a superior electrical characteristic. Such a SOI structure is made by forming a silicon oxide film as an insulator on an under silicon substrate and forming another silicon substrate (to be used as an active substrate), for example, a single-crystalline silicon layer on the silicon oxide film.

Referring to FIG. 1, a metal oxide silicon field effect transistor (MOSFET) having a conventional SOI structure is illustrated.

As shown in FIG. 1, an active region 2 is defined in a silicon substrate (not shown). A gate electrode 6 is arranged on the active region 2 of the silicon substrate.

FIG. 2 is a cross-sectional view taken along the line II—II of FIG. 1. As shown in FIG. 2, a silicon oxide film 3 is deposited over the silicon substrate which is denoted by the reference numeral "1". A second silicon substrate 4 having a trapezoidal cross-sectional structure is formed on the silicon oxide film 3. Subsequently, a gate oxide film 5 is formed over the resulting structure, including the second silicon substrate 4. A gate electrode 6 is sequentially formed over the gate oxide film 5.

As shown in FIG. 2, the second silicon substrate 4 has an inclined structure in that its thickness at the edge of the active region is smaller than its thickness at the middle portion of the active region. Due to such a structure, the depth of the depletion region is limited to the thickness of the second silicon substrate 4. As a result, the charge $Q_S$ of depleted bulk is limited by the thickness of the second silicon substrate 4, thereby decreasing the threshold voltage of the semiconductor device; as expressed in the following equations:

$$V_T = V_{FB} + Q_S/C_{OX} \quad (1)$$

$$C_{OX} = e_{OX}t_{OX} \quad (2)$$

where, $V_T$ represents the threshold voltage, $V_{FB}$ the flat band voltage, $Q_S$ the bulk charge, $C_{OX}$ the capacitance of the oxide film, $e_{OX}$ the dielectric constant of the oxide film, and $t_{OX}$ the thickness of the gate oxide film.

In this regard, it is impossible to increase the threshold voltage at the lower edge portion A of the second silicon substrate 4, even when the doped impurity concentration at that portion increases.

As a result, there is a difference in threshold voltage between the middle portion and edge portion A of the second silicon substrate 4. Due to such a difference in threshold voltage, the characteristic of drain current $I_D$ involves an inflection point, B, when it varies in accordance with a variation in gate voltage $V_G$, as shown in FIG. 3.

Since the characteristic of the conventional semiconductor device depends on the edge shape of the second silicon substrate, the production yield is degraded. Consequently, it is difficult to efficiently fabricate highly-integrated semiconductor devices.

SUMMARY OF THE INVENTION

Therefore, an object of the invention is to solve the above-mentioned problems and to provide a semiconductor device and a method for fabricating the same, capable of achieving an easy control of threshold voltage, thereby obtaining an improvement in production yield.

In accordance with one aspect of the present invention, the present invention provides a semiconductor device comprising: a silicon substrate; a first silicon oxide film formed over the silicon substrate; and active layer formed on the first silicon oxide film; second silicon oxide films respectively formed on opposite side walls of the active layer; a gate oxide film on the active layer; a gate electrode formed over the gate oxide film; and source/drain impurity diffusion regions respectively defined in portions of the active layer respectively disposed at opposite sides of the gate electrode.

In accordance with another aspect the present invention, the present invention provides a method for fabricating a semiconductor device, comprising the steps of: preparing a silicon substrate; sequentially forming a first silicon oxide film and an active layer over the silicon substrate; forming a silicon oxide film over the active layer and then forming a nitride film over the silicon oxide film; selectively removing the nitride film and the silicon oxide film, thereby exposing opposite side portions of the active layer; oxidizing the opposite side portions of the active layer using the nitride film left after its selective removal, thereby forming a second silicon oxide film; completely removing the nitride film and the silicon oxide film, and then sequentially forming a gate oxide film and a gate electrode on the active layer; and implanting impurity ions in portions of the active layer respectively disposed at both sides of the gate electrode, thereby forming source/drain impurity diffusion regions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
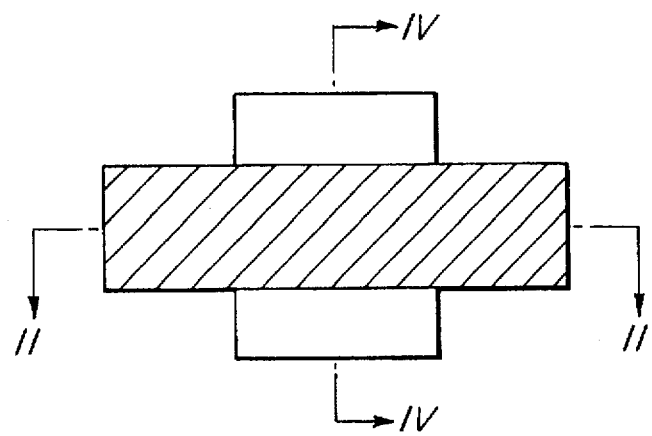
FIG. 1 is a view illustrating the layout of a MOSFET having a conventional SOI structure.
Figure 2:
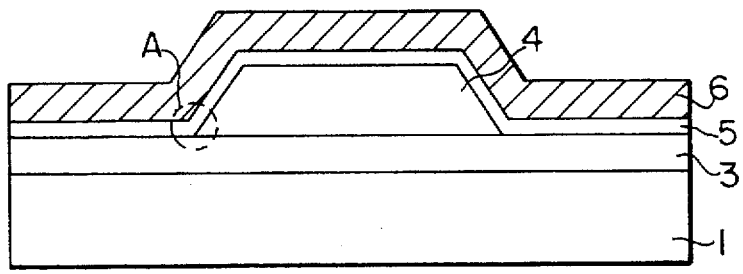
FIG. 2 is a cross-sectional view taken along the line II—II of FIG. 1.
Figure 3:
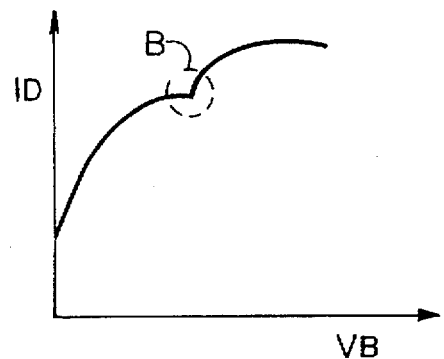
FIG. 3 is a graph illustrating an operating characteristic of the MOSFET having the conventional SOI structure.
Figure 4:
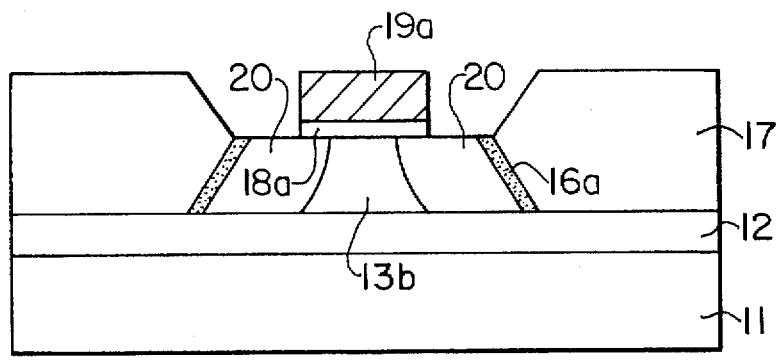
FIG. 4 is a cross-sectional view taken along the line IV—IV of FIG. 1, illustrating a MOSFET fabricated in accordance with the present invention.

FIG. 4 is a cross-sectional view taken along the line IV—IV of FIG. 1, illustrating a MOSFET fabricated in accordance with the present invention.

As shown in FIG. 4, the MOSFET, which has a SOI structure, includes a first silicon substrate 11, a first silicon oxide film 12 formed over the first silicon substrate 11, and a second silicon substrate 13b on the first silicon oxide film 12. Second silicon oxide films 17 are disposed on opposite side walls of the second silicon substrate 13b. The MOSFET also includes a gate oxide film 18a formed on a desired portion of the second silicon substrate 13b, a gate electrode 19a formed over the gate oxide film 18a, and source/drain impurity diffusion regions 20, respectively formed in portions of the second silicon substrate 13b disposed at both sides of the gate electrode 19a.

An impurity doped region 16a, having a conduction type opposite to that of the second silicon substrate 13b, is defined between each side wall of the second silicon substrate 13b and each corresponding second silicon oxide film 17 in order to obtain an increased threshold voltage.

The second silicon substrate 13b is used as an active layer.

Now, a method for fabricating the MOSFET having the above-mentioned structure will be described in conjunction with FIGS. 5A to 5E.

Figure 5A:
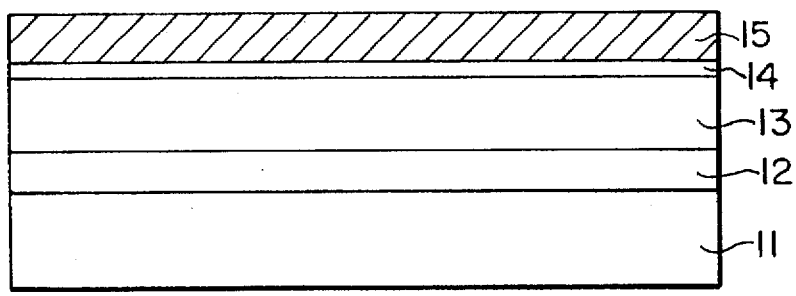
FIGS. 5A to 5E are sectional views illustrating sequential steps of a method for fabricating the MOSFET of FIG. 4 in accordance with the present invention.

In accordance with a method of the present invention, a first silicon substrate 11 is prepared first, and then, a first silicon oxide film 12 and a second silicon substrate 13 are sequentially formed over the first silicon substrate 11, as shown in FIG. 5A.

Thereafter, a stress-buffering silicon oxide film 14 and a nitride film 15 are formed over the second silicon substrate 13.

A polysilicon layer may be interposed between the stress-buffering silicon oxide film 14 and nitride film 15. In this case, the polysilicon layer is processed by a poly-buffered local oxidation of silicon (LOCOS) process, thereby forming a second oxide film.

Figure 5B:
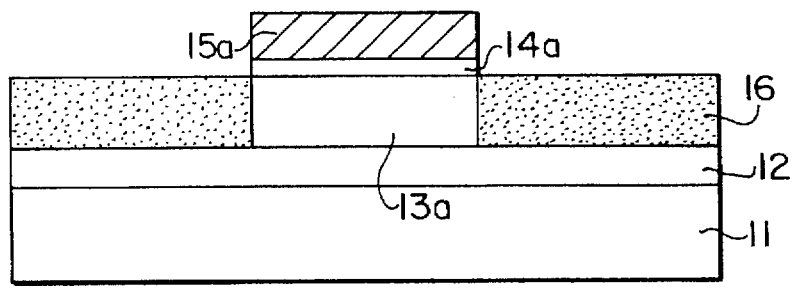
Figure 5C:
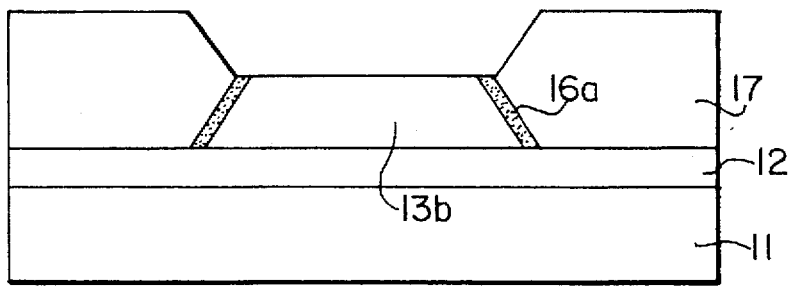
Figure 5D:
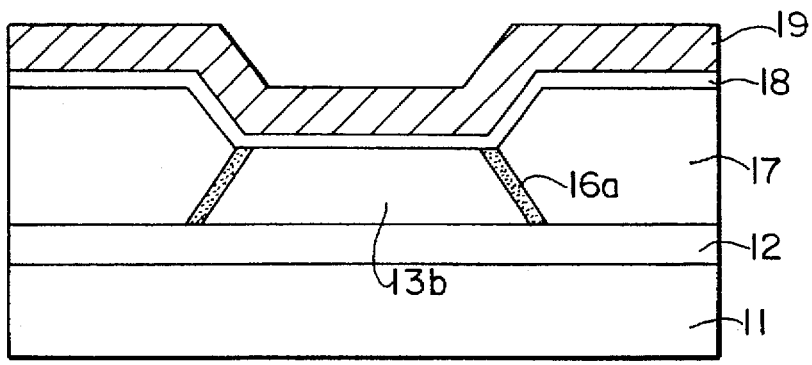

The nitride film 15 and silicon oxide film 14 are then selectively removed at their portions, except for those portions corresponding to the active region, thereby forming a silicon oxide film pattern 14a and a nitride film pattern 15a, as shown in FIG. 5B. At this time, the second silicon substrate 13 is partially exposed.

Impurity ions are then implanted in the exposed portions of the second silicon substrate 13, thereby forming impurity doped regions 16 for obtaining an increase in threshold voltage at the edge portion of the active region. The impurity ions have a P type conductivity when an NMOSFET is to be fabricated and a N type conductivity when a PMOSFET is to be fabricated.

In some cases, such impurity doped regions 16, adapted to obtain an increase in threshold voltage, may not be formed.

Using the nitride film pattern 15a as a mask, the exposed portions of the second silicon substrate 13a are then oxidized at a temperature ranging from 800° C. to 1,200° C., thereby forming a second silicon oxide film 17. The formation of the second silicon oxide film 17 is carried out in the same manner as the formation of an element-isolating oxide film, using a conventional LOCOS process.

The oxidation of the second silicon substrate 13a is carried out in such a fashion that the oxidation rate at the upper portion of the second silicon substrate 13a is higher than that at the lower portion of the same substrate. As a result, the second silicon oxide film 17 has an inclined structure at its inner side walls.

The impurity doped regions 16 also have an inclined structure because it is formed as the diffusion of the impurity ions and is carried out at the oxidation step.

The formation of the second silicon oxide film 17 is carried out until the thickness of the second silicon oxide film 17 is larger than the thickness (height) of the second silicon substrate 13b.

In the above oxidation, the second silicon substrate 13a is changed into a second silicon substrate 13b, which has a trapezoidal structure with inclined side walls.

Thereafter, a silicon oxide film 18 is formed over the entire exposed surface of the resulting structure including the exposed surface of the second silicon substrate 13b and the exposed surface of the second silicon oxide film 17. A conductive layer 19 is then formed over the silicon oxide film 18.

Subsequently, the silicon oxide film 18 and conductive layer 19 are selectively removed using a gate electrode mask, thereby forming a gate oxide film 18a and a gate electrode 19a.

Figure 5E:
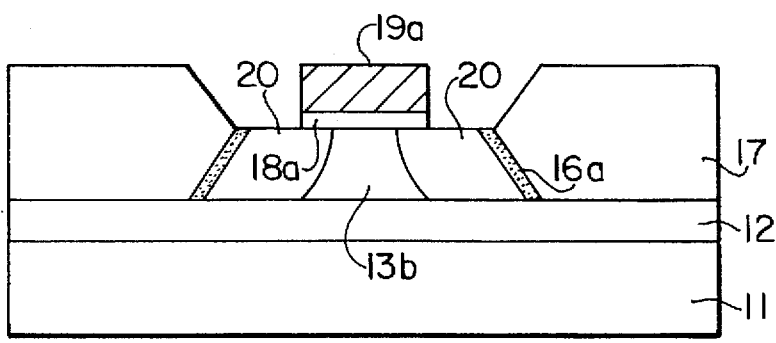

Finally, impurity ions are implanted in portions of the second silicon substrate 13b disposed at opposite sides of the gate electrode 19a, thereby forming source/drain diffusion regions 20 as shown in FIG. 5E.

As is apparent from the above description, a thick silicon oxide film is formed on each side wall of the second silicon substrate in accordance with the present invention. Accordingly, it is possible to obtain an increased threshold voltage at the edge of the second silicon substrate. Thus, the present invention achieves an easy control of threshold voltage, thereby obtaining an improvement in production yield.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device comprising the steps of:

preparing a silicon substrate;

sequentially forming a first silicon oxide film and a silicon layer over said silicon substrate;

forming a silicon oxide film over said silicon layer;

forming a nitride film over said silicon oxide film;

selectively removing said nitride film and said silicon oxide film, thereby exposing opposite side portions of said silicon layer;

oxidizing the opposite side portions of said silicon layer at a temperature ranging from 800° C. to 1200° C. using said nitride film left after its selective removal, thereby forming a second silicon oxide film that has a thickness larger than a height of said silicon layer;

completely removing said nitride film and said silicon oxide film, and then sequentially forming a gate oxide film and a gate electrode on said silicon layer; and implanting impurity ions in portions of said silicon layer, respectively disposed at both sides of said gate electrode, thereby forming source/drain impurity diffusion regions.

2. The method in accordance with claim 1, wherein said step of oxidizing the opposite side portions of said active layer has a faster oxidation rate at the upper portion of the opposite side portions than the lower portions such that the cross section of the silicon layer has a trapezoidal structure with inclined side walls.

3. The method in accordance with claim 1, wherein a polysilicon layer is deposited between said silicon oxide film and said nitride film.

4. A method for fabricating a semiconductor device comprising;

preparing a silicon substrate;

sequentially forming a first silicon oxide film and an active layer over said silicon substrate;

forming a silicon oxide film over said active layer;

forming a nitride film over said silicon oxide film;

selectively removing said nitride film and said silicon oxide film, thereby exposing opposite side portions of said active layer;

implanting impurity ions in a desired portion of said active layer, using said nitride film left after its selective removal, thereby forming an impurity doped region;

oxidizing the opposite side portions of said active layer using said nitride film left after its selective removal, thereby forming a second silicon oxide film;

completely removing said nitride film and said silicon oxide film, and then sequentially forming a gate oxide film and a gate electrode on said active layer; and implanting impurity ions in portions of said active layer, respectively disposed at both sides of said gate electrode, thereby forming source/drain impurity diffusion regions.

5. The method in accordance with claim 4, wherein said impurity doped region is formed at an interface between said active layer and said second silicon oxide film.

6. The method in accordance with claim 4, wherein said impurity doped region is formed at an interface between said active layer and said second silicon oxide film.

7. The method in accordance with claim 4, wherein said impurity doped region is formed at an interface between said active layer and said second silicon oxide film.

8. A method of fabricating a semiconductor device, comprising the sequential steps of:

preparing a silicon substrate;

forming a first silicon oxide film and an active layer over said silicon substrate;

forming a silicon oxide film over said active layer, and then forming a nitride film over said silicon oxide film;

selectively removing said nitride film and said silicon oxide film, thereby exposing opposite side portions of said active layer;

using said nitride film left after its selective removal as a mask to selectively implant impurity ions in the exposed portions of said active layer to form an impurity doped region of said active layer;

oxidizing the impurity doped portions of said active layer at a temperature ranging from 800° C. to 1,200° C. using said nitride film left after its selective removal, thereby forming a second silicon oxide film on the opposite side portions of the active layer, and simultaneously diffusing impurity ions from said impurity doped region into the side walls of the active layer;

completely removing said nitride film and said silicon oxide film, and then sequentially forming a gate oxide film and a gate electrode on said active layer; and implanting impurity ions in portions of said active layer, respectively disposed at both sides of said gate electrode, thereby forming source/drain impurity diffusion regions.

9. The method of claim 8 wherein;

said step of oxidizing the impurity doped portions of said active layer has a faster oxidation rate at the upper portion of the doped portions than the lower portions such that the second silicon oxide film has an inclined structure at its inner side walls; and the active layer has a first conductivity type and the impurity doped region of the active layer has a second conductivity type.

* * * * *